US006900660B2

(12) United States Patent
Piasecki et al.

(10) Patent No.: US 6,900,660 B2
(45) Date of Patent: May 31, 2005

(54) IC WITH DIGITAL AND ANALOG CIRCUITS AND MIXED SIGNAL I/O PINS

(75) Inventors: Douglas S. Piasecki, Austin, TX (US); Alvin C. Storvik, II, Austin, TX (US)

(73) Assignee: Silicon Labs CP, Inc., Austin, TX (US)

( * ) Notice: Subject to any disclaimer, the term of this patent is extended or adjusted under 35 U.S.C. 154(b) by 113 days.

(21) Appl. No.: 10/347,709

(22) Filed: Jan. 21, 2003

(65) Prior Publication Data

US 2003/0107397 A1 Jun. 12, 2003

Related U.S. Application Data

(63) Continuation of application No. 09/837,921, filed on Apr. 18, 2001, now Pat. No. 6,509,758.

(51) Int. Cl.$^7$ .............................................. H03K 19/177
(52) U.S. Cl. .............................. 326/41; 326/37; 326/47
(58) Field of Search ................................ 326/37–41, 47

*Primary Examiner*—Ahn Q. Tran
(74) *Attorney, Agent, or Firm*—Howison & Arnott, L.L.P.

(57) ABSTRACT

An integrated circuit providing mixed signal processing. I/O pin interface circuits include logic gates and other circuits for processing digital and analog signals. Processor-controlled configuration circuits allow the various I/O pin interface circuits to process either analog or digital circuits. The I/O pins can be configured for digital or analog operation on the fly.

10 Claims, 3 Drawing Sheets

IC WITH DIGITAL AND ANALOG CIRCUITS AND MIXED SIGNAL I/O PINS

RELATED APPLICATIONS

This patent application is a Continuation of U.S. Pat. No. 6,509,758 which issued on Jan. 21, 2003, identified by Ser. No. 09/837,921, filed Apr. 18, 2001, entitled "IC with Digital and Analog Circuits and Mixed Signal I/O Pins," which is related to U.S. application entitled "Priority Cross-Bar Decoder" identified by Ser. No. 09/584,308, filed May 31, 2000; and U.S. Application entitled "Cross-Bar Matrix For Connecting Digital Resources to I/O Pins Of An Integrated Circuit" identified by Ser. No. 09/583,260 filed May 31, 2000. This application is also related to U.S. Pat. No. 6,507,215, which issued on Jan. 14, 2003, identified by Ser. No. 09/837,918, filed Apr. 18, 2001 entitled "Programmable Driver for an I/O Pin of an Integrated Circuit." The subject matter of all applications is incorporated herein by reference thereto.

TECHNICAL FIELD OF THE INVENTION

The present invention relates in general to input/output circuits for semiconductor devices, and more particularly to integrated devices having analog and digital circuits.

BACKGROUND OF THE INVENTION

The large scale integration of a number of devices or circuits is advantageous as it allows numerous functions to be carried out within a single integrated circuit. On the one hand, semiconductor dies or chips can be made larger to accommodate a larger number of circuits and corresponding functions. Conversely, significant improvements in lithography techniques have been achieved in order to make the existing circuits smaller so that additional circuits can be formed within a chip, without utilizing a larger-sized semiconductor chip. In order to fully utilize the functions provided by the circuits formed within the chip, I/O pins or ports are necessary. In some situations, if additional I/O pins are needed, then they are simply added to the chip as metallic pads or pins. It can be appreciated that, based on a given size of the semiconductor die, only a reasonable number of I/O pins can be accommodated. Some integrated circuits, especially those that are microprocessor-based, have more than one hundred I/O pins. The I/O pins can be formed not only on the edge of the chip, but also on the planar face of the chip.

A problem exists when there are more signals or functions than corresponding pins available on the integrated circuit. One practice has been to multiplex plural signals, with respect to a single I/O pin. The multiplexing is carried out by a simple logic circuit that selects one of the signals for use with the I/O pin at any given time. An example of the use of multiplexers for coupling plural signals to a pin is set forth in U.S. Pat. No. 6,057,705. I/O pins of an integrated circuit have been utilized for both outputting digital signals via the pin, and inputting digital signals via the pin. An example of such type of input/output pin interface circuit is shown in U.S. Pat. No. 5,686,844.

In mixed signal integrated circuits, such as microprocessors integrated with A/D and D/A converters, the I/O pins must be able to accommodate not only digital signals, but also analog signals. It is a conventional practice in microcontrollers to utilize a first set of I/O pins for digital signal processing, and a second set of I/O pins for analog signal processing. This type of integrated circuit is partitioned to separate the analog and digital circuits, as well as the I/O pins, because of the significant difference in the signal processing circuits. The digital circuits are, of course, binary operated. However, such type of circuits generate noise because of the high speed transitions of the digital signals. While the noise signals do not adversely affect digital circuits, such type of aberrations are highly undesirable in analog circuits. As such, it has been a conventional practice to not only separate the digital circuits from the analog circuits, but also maintain the analog and digital functions distinct as to the integrated circuit I/O pins. Although this limited I/O pin sharing feature provides a certain degree of flexibility, there exists other situations in which this solution is not acceptable.

From the foregoing, it can be seen that a need exists for a technique to improve the flexibility by which the various signals or functions of an integrated circuit device are made available to the I/O pins. Another need exists for a pin interface circuit that can accommodate both digital and analog signals. Yet another need exists for a technique for assigning digital and/or analog functions to an I/O pin. A further need exists for a technique to provide multiple analog circuits on a mixed signal integrated circuit, and utilize the I/O pin interface circuits for the input and output of both digital and analog signals.

SUMMARY OF THE INVENTION

In accordance with the principles and concepts of the invention, there is disclosed a pin interface circuit for use on an integrated circuit, which allows both analog and digital signals to be coupled to respective processing circuits, via a single I/O pin. In accordance with one form of the invention, the metallic pad of an I/O pin is coupled via a pin interface circuit to both analog and digital circuits formed on the semiconductor chip. The I/O pin interface is connected to the outputs of various digital circuits for driving the pin with digital signals, and connected to inputs of other digital circuits for receiving digital signals from the I/O pin. In addition, analog circuits formed on the integrated chip are connected to the I/O pin for receiving analog signals therefrom. While not employed in one embodiment of the invention, analog output circuits formed on the chip can be connected to the I/O pin for driving such pin with analog signals.

When the I/O pin interface is configured for analog use, an enable signal is coupled to the digital circuits connected to the pin for disabling the same. This prevents mid-region operation by the various digital gates when the analog signals are in the mid-voltage range of operation of the digital logic. In other applications of the invention, the digital circuits may remain enabled during the analog mode of operation.

In accordance with another feature of the invention, the I/O pin interface can be configured as an output pin driven with digital or analog signals generated on the chip, and such signals can be coupled back to monitoring circuits on the chip to monitor the performance of the digital or analog signals.

In yet another embodiment of the invention, an integrated circuit employing mixed signal circuits incorporates one or more analog-to-digital converters and one or more digital-to-analog converters, and a multiplexer for routing the analog signals between the various I/O pin interface circuits and the converters.

In the various embodiments of the invention, a programmable circuit functions to configure the various pins so to be operational to couple either analog or digital signals between the I/O pads and the mixed signal circuits.

BRIEF DESCRIPTION OF THE DRAWINGS

Further features and advantages will be apparent from the following and more particular description of the preferred and other embodiments of the invention, as illustrated in the accompanying drawings in which like reference characters generally refer to the same parts or elements throughout the views, and in which.

DETAILED DESCRIPTION OF THE INVENTION

Figure 1:
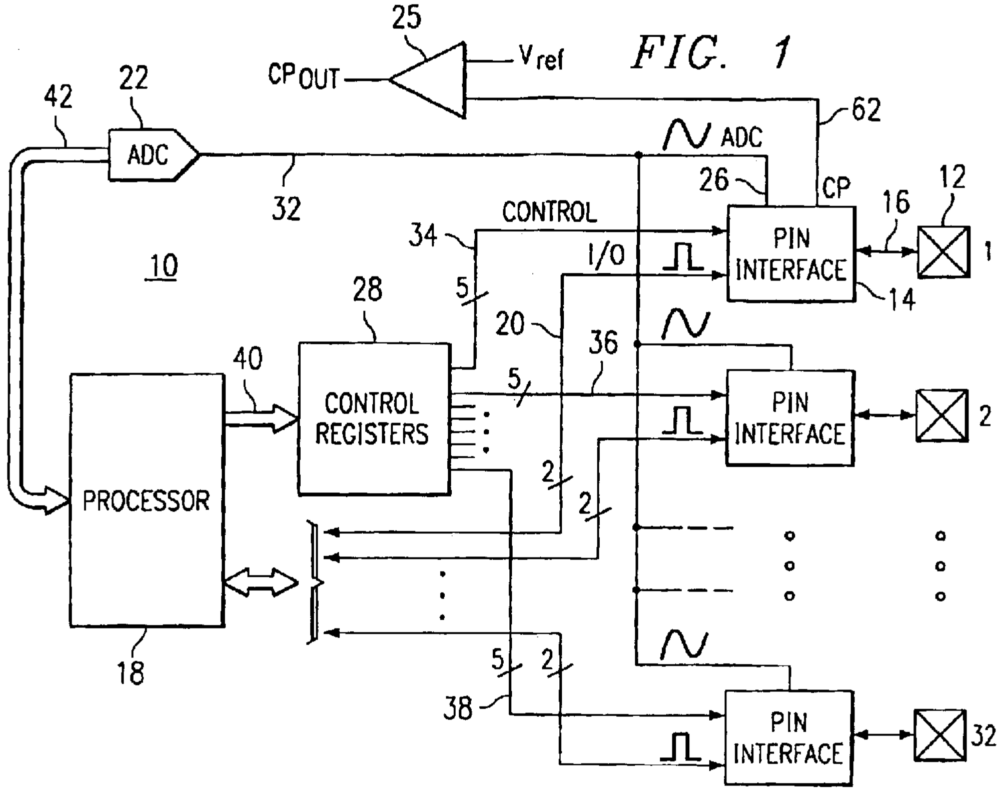
FIG. 1 illustrates a generalized block diagram of the digital and analog circuits, and the control signals for controlling the I/O pin interface circuits.

With reference now to FIG. 1, there is illustrated the various analog and digital circuits involved in the described embodiment that utilize many of the analog/digital pin interface circuits and corresponding contact pads of the integrated circuit 10. The integrated circuit 10 includes a number of contact pads or connection pins, designated numerically from one to thirty-two. Although only thirty-two I/O pins are illustrated, the invention can be adapted to any circuit irrespective of the number of I/O pins. Each pin, for example, $Pin_1$ is coupled to a pin interface 14. The pin interface 14 couples analog or digital signals to or from the I/O contact pad 12 on conductor 16. The pin interface 14 can couple digital signals to digital circuits, such as a processor 18 on one conductor of a two-wire path 20, or receive digital signals therefrom on the other conductor of the two-wire path 20. The pin interface 14 can also couple analog signals to analog circuits, such as an analog-to-digital converter 22, by way of a common analog line 32. Those skilled in the art may also find it advantageous to couple the common analog line 32 to other types of analog processing circuits, such as analog wave shaping circuits, comparators, amplifiers, etc. The externally-generated analog signals received from the pin interface 14 are coupled via a transmission gate in the pin interface on analog line 26. The analog signals coupled to the pin interface 14 can also be coupled on line 62 to a comparator 25 for comparison with either a fixed or programmable reference voltage. Other analog monitor circuits can also be utilized.

The analog transmission gate in each pin interface circuit is controlled by a respective control line connected to a control register circuit 28. The analog output of each such analog transmission gate is wire-OR'd together to form the common analog line 32. The overall function of the transmission gates in the respective pin interface is to provide a 32:1 multiplexer. The processor 18 controls the logic states of the registers in the circuit 28 to select which one of the thirty two analog transmission gates will be active to couple the associated analog signal to the ADC 22. While FIG. 1 illustrates in principle the distributed nature of the analog transmission gate multiplexer, other unified multiplexers could be utilized. In addition, those skilled in the art may prefer to employ different multiplexer arrangements, such as 32:2 type multiplexers, and others.

Each of the other pin interface circuits are interconnected and operate in the same manner for coupling digital signals between the respective contact pads and the processor 18, or for coupling analog signals between the contact pads and the ADC 22 and/or comparator 25. Each pin interface circuit is controlled as to whether the operation thereof will be digital or analog, using control signals output by control registers 28. The control registers 28 provide a number of outputs for controlling distributed analog multiplexing circuits in the pin interfaces. In the example, since there are thirty-two pin interface circuits with corresponding contact pads, the control register circuit 28 provides thirty-two separate control signals for individually controlling the multiplexing circuits in each pin interface. The control register circuit 28 also provides other control signals for controlling the pin interfaces. For example, on the five control register outputs 34, the various circuits of the first pin interface 14 are controlled. Control register outputs 36 control the circuits in the second pin interface, and so on in a similar manner. Lastly, the pin interface associated with pin 32 is controlled by signals on control register lines 38.

The various circuits of the integrated circuit 10 shown in FIG. 1 operate in the following manner. When it is desired to configure a pin interface for receiving digital signals and driving the same on the respective contact pads, the following operations are carried out. The processor 18 is programmed to configure the pin interfaces in various modes. When it is desired to configure the pins for driving digital signals, control signals are generated by the processor 18 and coupled on bus 40 to the control registers 28. The control registers 28 latch the control signals therein and provide steady state control signals to the various pin interface circuits to be controlled. In order to configure the first pin interface 14 for driving digital signals, a control signal is placed on one conductor of control line 34 to configure the first pin interface 14 into a mode for driving digital signals to the I/O contact pad 12. The processor 18, then transmits digital signals on one line of the 2-wire bus 20 directed to the first pin interface 14. The pin interface 14 then drives such digital signals on conductor 16 to the I/O contact pad 12.

When it is desired to configure the pin interface 14 in a mode for receiving externally-generated digital signals from the I/O contact pad 12, appropriate control signals are generated by the processor 18 and transferred to the control registers 28 on bus 40. The control signals on line 34 will be maintained for the digital operating mode, but the processor 18 will reconfigure itself so as to receive digital signals from the pin interface 14 on the other conductor of the 2-wire bus 20. In this manner, digital signals are coupled externally to the I/O contact pad 12, and therefrom to the processor 18 via the pin interface 14. The remaining pin interface circuits function in the same manner.

When it is desired to configure the pin interfaces, such as the first pin interface 14 for operating in an analog mode, the processor 18 writes the appropriate control registers 28 to provide different control signals on the control lines 34. When configured for analog operation, the pin interface 14 receives externally-generated analog signals from the I/O contact pad 12 and couples the same via an internal transmission gate on analog line 26 to the common analog line 32. When configured for analog operation, the control registers 28 are also written to produce appropriate logic states on the bus 34, whereupon the internal analog transmission gate is enabled. The analog line 26 is thus selected for coupling the analog signals thereon through the transmission gate to the common analog output line 32. Analog signals can thus be coupled from the I/O contact pad 12 through the pin interface 14 to the analog-to-digital converter 22. When the ADC 22 converts the analog signals to corresponding digital signals, such digital signals can be coupled on the bus 42 to many other digital circuits, including the processor 18. The digital signals on bus 42 can then be processed by the processor 18 and the result thereof transmitted back to the pin interfaces during a digital mode of operation.

As noted above, the analog signals can also be coupled from the pin interface 14 to the comparator 25 for comparison with a predefined or programmable reference voltage. If all the analog lines of each pin interface are to be used for comparison with a reference voltage, the common analog line 32 can be connected to the input of the comparator 25.

While the pin interface 14 is illustrated in FIG. 1 as being configured so as to provide for the input of analog signals, the output of analog signals can also be achieved. In providing a bi-directional flow of analog signals with regard to the pin interface 14, the pin interface transmission gate can be controlled to allow externally-generated analog signals to not only be input to the pin interface 14, but also allow internally-generated analog signals to be output therefrom as well. With this alternate arrangement, on-board analog signal generating circuits can be coupled through an analog selector or multiplexing arrangement to the common analog bus 32, for transferring the analog signals to the various pin interfaces.

Figure 2:
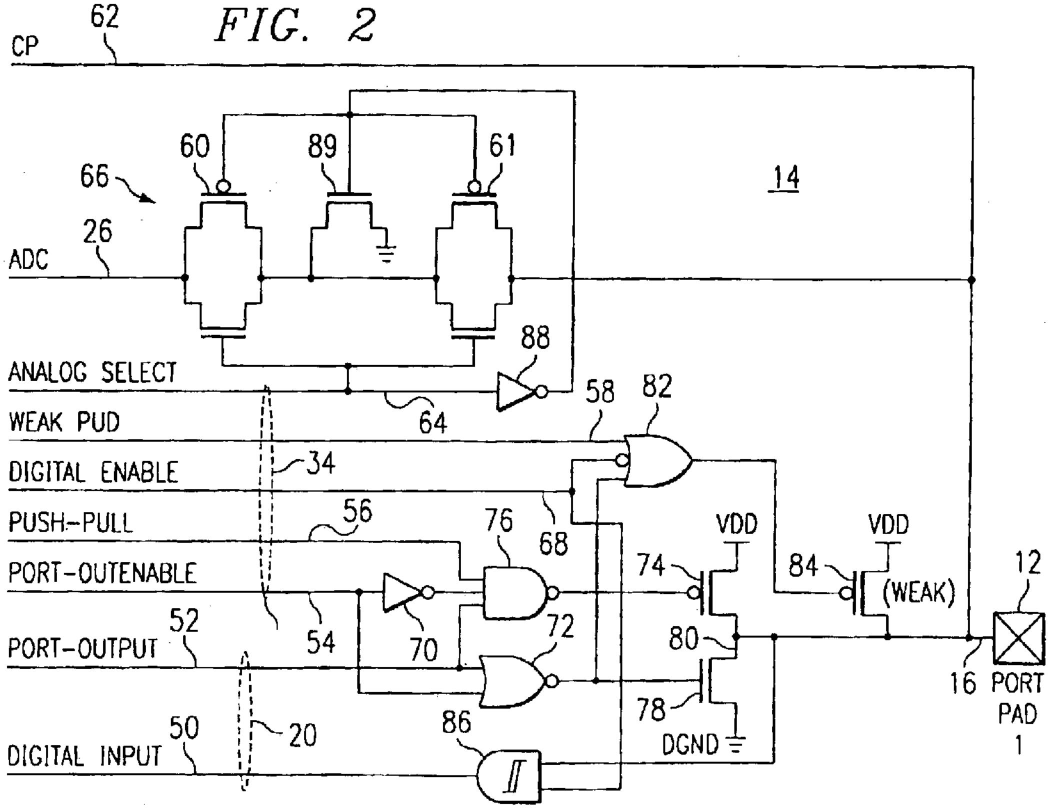
FIG. 2 illustrates the details of an I/O pin interface circuit according the described embodiment.

Reference is now made to FIG. 2 where there is shown in functional detail only one pin interface circuit 14. The other pin interface circuits are constructed and operate in an identical manner. While the various logic functions carried out by the pin interface circuit are shown as implemented by traditional logic gates, in practice such functions are carried out by various types of transistor circuits which perform the logic functions. Those skilled in the art can readily devise many different types of transistor circuits to carry out the noted logic functions. Many of the signals coupled to the pin interface circuit 14 are generated by the microprocessor 18. In the preferred embodiment, a triplet of the signals is coupled to each pin interface circuit by way of a priority cross-bar decoder. The cross-bar decoder circuit is described in detail in pending applications of the assignee identified as U.S. application Ser. No. 09/584,308 filed May 31, 2000 and application Ser. No. 09/583,260 filed May 31, 2000, the subject matter of such applications being incorporated herein by reference. In view that a cross-bar decoder is not essential to the operation of the present invention, such circuit will not be described here. Rather, it is sufficient to understand that the pin interface circuit 14 of the invention need only be coupled either directly or indirectly to analog and digital circuits, and controlled accordingly by suitable control circuits.

The relevant signals shown in connection with the pin interface circuit 14 of FIG. 2 function in the following manner. The Digital Input signals carried on line 50 constitute the digital signals coupled from the I/O contact pad 12 to the digital circuits 18 of the integrated circuit 10. The signals carried on the Port-Output line 52 are the digital signals coupled from the digital circuits 18 of the integrated circuit 10 to the I/O contact pad 12. Lines 50 and 52 constitute the two-wire bus conductor 20 shown in FIG. 1. The Port-Outenable line 54 carries the control signals generated by the processor 18, or support circuits therefor, for enabling and disabling operation of the pin interface circuit 14. In particular, when the Port-Outenable signal on line 54 is driven by the multiprocessor 18 to a logic low state, the pin interface circuit 14 is operative to allow digital signals to be output to the I/O contact pad 12. When at a logic high state, the Port-Outenable line 54 causes the conductor 16 coupling the pin interface circuit 14 to the contact pad 12, to be driven to a high impedance state. The Push-Pull line 56 carries signals which allow a push-pull driver of the pin interface circuit 14 to be operational. The Weak Pud signal on line 58 controls the operation of a weak pull-up transistor coupled to the conductor 16. The ADC signal on line 26 is the analog signal carried from the I/O contact pad 12 to the common analog line 32 of FIG. 1. Control lines 54,56,58,64, and 68 of FIG. 2 constitute the five-wire bus conductor 34 shown in FIG. 1.

The CP signal on line 62 can be coupled to the comparator 25 shown in FIG. 1. The processor 18 can cause digital or analog signals carried on the conductor 16 to be coupled to the comparator 25 for comparison with a reference voltage that is programmable to different amplitudes. While only pin interface circuit 14 is shown equipped with the capability of being coupled to the comparator 25, one or more of the other pin interface circuits can be designed to provide a similar function.

The Analog Select signal on control line 64 controls an analog transmission gate circuit 66 to allow the coupling of externally-generated analog signals input to the I/O contact pad 12 to analog signal processing circuits. In practice, the analog transmission gate circuit 66 is a pair of series-connected analog transmission gates 60 and 61, which if enabled, allows analog signals to pass therethrough in either direction. Each transmission gate 60 and 61 each constitutes a P-channel and N-channel transistor. The Analog Select control signal on line 64 drives the N-channel transistors, and such control signal drives the P-channel transistors by way of an inverter 88. If the transmission gate 66 is not enabled, the connection between the individual transmission gates is pulled to a ground potential by transistor 89, thereby isolating the unused terminals which may otherwise have digital signals, noise, cross-talk or other signals imposed thereon. This is an important feature of the pin interface 14 because it enables the multiplexer to select or to isolate the analog signal at the I/O contact pad 12 or pin location. Otherwise, thirty-two analog signals would have to be routed to a multiplexer cell located external to the pin interfaces. With this invention, only one analog route, (or fewer than thirty-two routes—depending on the manner in which external multiplexers 24 are configured, see FIG. 3), is connected to all of the pin interfaces being multiplexed onto the common analog line 32. This enables the pin interfaces to be distributed more ubiquitously about the perimeter or area of the semiconductor chip (or PCB).

The Digital Enable signal on control line 68 disables the weak pull-up transistor 84 and the logic gate 86 during analog operation. Automatic disabling of the weak pull-up transistor 84 is optional.

In the operation of the pin interface circuit 14 of FIG. 2, a logic high state of the Port-Outenable signal on line 54 is coupled through an inverter 70 to present a logic low state on an input of NAND gate 76. The output of the NAND gate 76 is a logic high which drives a P-channel transistor 74 of a push-pull driver, thereby turning it off. The Port-Outenable signal on line 54 also drives an input of a NOR gate 72 in the pin interface circuit 14. The output of the NOR gate 72 drives an N-channel driver transistor 78 of the push-pull driver to a low level, thereby turning it off. As a result, push-pull output 80 of the driver transistors 74 and 78 is placed in a high impedance state, which state is coupled to the corresponding I/O contact pad 12 via conductor 16. Thus, when the Port-Outenable signal is at a logic high state, the I/O contact pad 12 is driven to a high impedance state. This feature can be advantageously used when it is desired to place an I/O pin of the integrated circuit 10 in an input mode. The tristate condition of the driver can also be used when the signals of the integrated circuit 10 are "settling" to a stable state. This prevents temporary-state transitions and glitches from appearing at the I/O contact pad. Also, when the Port-Outenable signal is high during this transition period, no erroneous signals will appear at the I/O contact pad 12. Those skilled in the art may also utilize additional circuits connected to the P-channel driver transistor 74 and the N-channel driver transistor 78 to prevent both such transistors from being driven into conduction at the same time. Moreover, those skilled in the art may find that not all pin interface circuits should be driven into a high impedance state at the same time. To that end, different control lines in lieu of line 54 can be coupled to the pin interfaces.

With reference again to the I/O pin interface circuit 14, it is noted that if the driver is configured to an operational state in which the logic state on line 54 is at a low state, the I/O contact pad 12 can be driven to the logic state corresponding to the data on the Port-Output line 52. As noted in FIG. 2, the Port-Output signal on line 52 is coupled to an input of the NOR gate 72, as well as to an input of the NAND gate 76. For purposes of example, it is assumed that the driver transistors 74 and 78 are to be operated in a push-pull manner. Accordingly, the Push-Pull control line 56 is driven by the microprocessor 18 to a logic high level. Assuming further that the logic state on the Port-Output line 52 is driven to a logic high, then the output of the NOR gate 72 will be logic low, thereby turning off the N-channel driver transistor 78. On the other hand, the output of the NAND gate 76 will be at a logic low level, thereby driving the P-channel driver transistor 74 into conduction. The I/O contact pad 12 will thus be driven to a logic high state, corresponding to the logic high state on the Port-Output line 52. Digital data can thus be coupled from the Port-Output line 52 to the I/O contact pad 12.

If, on the other hand, the logic state of the digital data on the Port-Output line 52 is at a logic low state, then the output of the NOR gate 72 will be logic high state. The output of the NAND gate 76 will be at a logic high state also. The P-channel driver transistor 74 will thus be turned off, while the N-channel driver transistor 78 of the push-pull pair will be driven into conduction. The logic state of the I/O contact pad 12 is thus a logic low, corresponding to the logic low state on the Port-Output line 52.

In the event that the I/O contact pad 12 is to be provided with a weak pull-up, then the control line 58 is driven to a logic low state. If the output of the NOR gate 72 is also at a logic low state, the OR gate 82 will bias the P-channel driver transistor 84 into conduction. The weak pull-up transistor 84 is constructed with a long conduction channel, thereby providing a high resistance between the supply voltage VDD and the I/O contact pad 12. A weak pull-up to the I/O contact pad 12 is thus provided. A separate weak pull-up control line is coupled to each of the pin interface circuits, and such lines are controlled by way of the control registers 28. In like manner, each pin interface circuit is controlled by a separate Push-Pull control signal line, one shown as reference number 56. The push-pull control lines are also controlled by the control registers 28.

In order to configure the I/O contact pad 12 for the input of digital signals, the Port-Outenable signal on line 54 is driven to a logic high state. As noted above, both push-pull transistors 74 and 78 are turned off, thereby placing the I/O contact pad 12 in a high impedance state. Accordingly, external analog and digital signals can be applied to the I/O contact pad 12. The input digital signals on I/O contact pad 12 are coupled via the conductor 16 to an input of AND gate 86, and therethrough to Digital Input line 50. With reference to FIG. 1, the input data signals on line 50 of bus 20 can be coupled to the microprocessor 18 or other digital circuits.

As noted above, when the I/O contact pad 12 is utilized for the input or output of digital signals, the Digital Enable signal on control line 68 is driven to a logic high level. The logic high input to the two-input AND gate 86 allows digital signals to be passed from the I/O contact pad 12 to the microprocessor 18. Also, the logic high state of the Digital Enable signal places an enabling signal on the inverting input of the OR gate 82, thereby enabling operation of the Weak Pull-up transistor 84, if the Weak PUD signal on line 58 is asserted. As can be appreciated, the foregoing represents an OR function in controlling the weak pull-up transistor 84.

When it is desired to configure the I/O contact pad 12 for receiving analog signals, the Port-Outenable control signal on line 54 is driven to a logic high state, thereby placing the push-pull transistors 74 and 78 in a high impedance state. Additionally, the Digital Enable signal on control line 68 is driven to a logic low. This disables the weak pull-up transistor 84 via the OR gate 82, and disables the AND gate 86. It is important to disable the logic gates having inputs coupled to the I/O contact pad conductor 16, otherwise the analog voltages may not only drive the logic gates to different states, but may also activate push-pull transistors in such gates so that current flows therethrough. In other words, analog voltage levels may be encountered on the I/O contact pad 12 that will not drive the logic gates to either a logic high or low state, but rather drive such gates to an indeterminate logic state. Such indeterminate logic states can often cause unnecessary current flow therein, which is wasteful of power in the integrated circuit. Various types of logic gates may include additional protection circuits to prevent large current flow therethrough when driven by a signal with an indeterminate logic state. When utilizing such type of logic circuits, the AND gate 86 may not be required to be disabled during analog operation.

In any event, when the pin interface circuit 14 is configured for analog operation, the Analog Select signal on control line 64 is driven to a logic high state, thereby allowing signals to be passed through the analog transmission gate circuit 66. As noted above, each pin interface circuit includes a transmission gate circuit which is part of a distributed multiplexer. Analog signals can thus pass unimpeded from the I/O contact pad 12 to the analog-to-digital converter 22. When it is desired to convert the analog signals coupled to I/O contact pad 12 to corresponding digital signals, the appropriate control signals are generated by the microprocessor 18, are latched in the control register 28, and are coupled to the pin interface circuits. In the embodiment shown in FIGS. 1 and 2, only one pin interface circuit is enabled for analog operation at a time. The pin interface circuit enabled for analog operation will couple the analog signals coupled thereto to the common analog line 32 via the analog transmission gate circuit in the enabled pin interface circuit. In the other pin interface circuits disabled for analog operation, the isolated transistor 89 in the respective analog transmission gate circuits will be driven into conduction, thereby providing electrical isolation between the common analog line 32 and the circuits of the disabled pin interface circuits. The microprocessor 18 can also control the ADC circuit 22 to commence conversion of the analog signal to a corresponding digital word.

As noted in FIGS. 1 and 2, the input of the comparator 25 is also coupled to the I/O contact pad 12 connected to the pin interface 14. Either analog signal levels or digital signal levels can be compared with a reference voltage to verify acceptable circuit operation. Indeed, the microprocessor 18 can drive the I/O contact pad 12 with a logic level, and verify with the comparator 25 that such level is within specified limits. The comparison operation can be carried out by increasing (or decreasing) the variable reference voltage until the output of the comparator changes state. The voltage magnitude of the signal on the I/O contact pad 12 can thus be determined.

As an alternative, a signal coupled to the I/O contact pad 12, whether it be a digital input/output or analog signal, may be routed through the respective analog transmission gate circuit 66 as previously described, and measured directly by the ADC 22 using N bits of resolution. This feature of the present invention adds to the capabilities of the commonly known SCAN testing method. With SCAN chain testing, there is provided the ability to test the digital I/O signals coupled to the integrated circuit. This invention in one of its embodiments may be extended to add analog level sensitivity testing to the scan chain by using the comparator 25 or ADC 22 as described above, to measure the signal amplitude on the I/O contact pad 12 and provide a pass or fail condition as appropriately determined by the scan chain.

Figure 3:
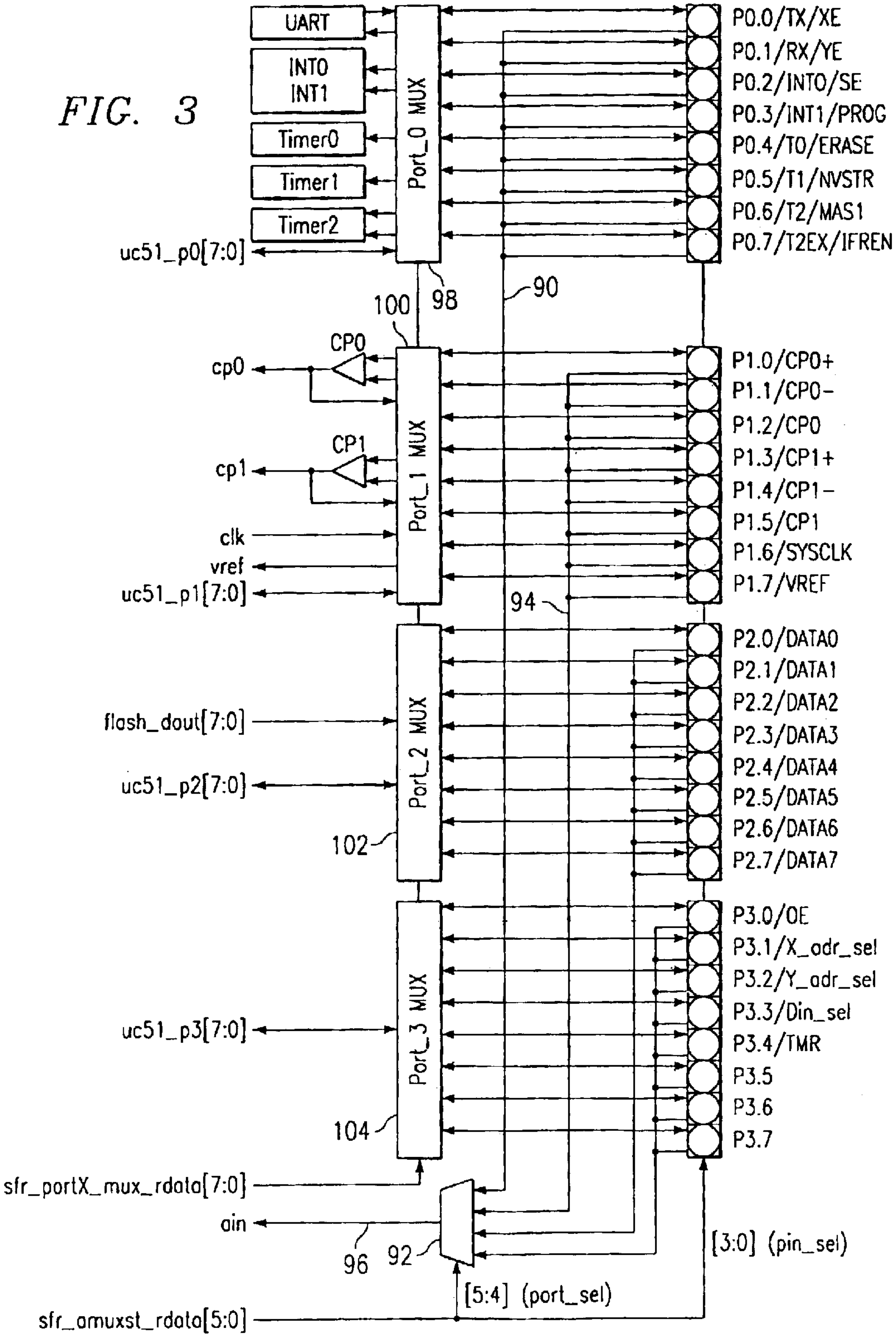
FIG. 3 illustrates in a detailed manner how the analog lines from the pin interface circuits are multiplexed together.

With reference now to FIG. 3, there is illustrated a preferred embodiment of the invention, showing the manner in which the digital and analog lines of each pin interface are connected to the respective support circuits. Shown are four ports, each having eight I/O contact pads, totaling thirty-two I/O contact pads for the integrated circuit 10. The designation, for example P1.6/SYSCLK, identifies port 1 of the four ports, and pin 6 of that port. The pneumonic identifier indicates that the system clock signal can be multiplexed onto the port pin. In contrast with the embodiment shown in FIG. 1, where each analog conductor of the thirty two pin interface circuits is connected to a common analog line 32, single multiplexer 24, the multiplexing arrangement shown in FIG. 3 is different. In the FIG. 3 embodiment, the analog lines of each port interface driver in a group are connected together to provide a common analog line for the group. In other words, each of the eight pin interface circuits of port 0 are coupled together, and extended by a common analog line 90 to one input of a four-input multiplexer 92. The eight analog lines of port 1 are similarly connected together, and extended as a second common analog line 94 to a second input of the multiplexer 92. The analog lines of the port 2 and port 3 groups of pin interfaces are similarly connected and coupled as respective third and fourth common analog lines to the remaining two inputs of the multiplexer 92. The multiplexer 92 requires only two digital signals for decoding in order to select one of the four analog inputs for coupling signals on the selected common analog line to the output 96 of the multiplexer 92. With this arrangement, fewer conductors are required to be extended between the port interface driver circuits and the multiplexer 92. While not specifically shown, each group of port interface driver circuits requires an analog select decoder for decoding a 3-bit digital word to select one of the analog select signals 64 of each group. With this arrangement, even if multiple port I/O contact pads are driven by analog signals, the operation of only one analog transmission gate circuit 66 (FIG. 2) ensures that only single analog signal is coupled from that group on the common analog line to the multiplexer 92. As can be appreciated, even though a multiplexer 92 external to the port interface driver circuits is utilize, the distributed multiplexer employing the analog transmission gate circuits 66 is nevertheless used in each pin interface circuit.

As further shown in FIG. 3, there are additional multiplexers 98–104 for multiplexing the digital signals with regard to the various pin interface groups, and port I/O contact pads.

Various other analog line multiplexing schemes can be utilized. For example, the first analog line of each port can be connected in common to one input of an eight-input multiplexer. The second analog lines of each port can similarly be connected together and coupled to a second input of the multiplexer. The other six analog lines of the four ports can be similarly connected to the multiplexer. With eight multiplexer inputs, a 3-bit word can be used to select which one of the eight analog lines is to be coupled to the ADC, or to other analog processing circuits, such as comparators, amplifiers wave shaping circuits, etc.

From the foregoing, disclosed is a pin interface circuit adapted for carrying both analog and digital signals. The pin interface circuit can be configured to carry digital signals through the pin interface circuit to the port I/O contact pad in one direction, or in the other direction. In addition, the pin interface circuit can be configured to disable the digital circuits so that analog signals can be carried therethrough without affecting the digital circuits.

Figure 4:
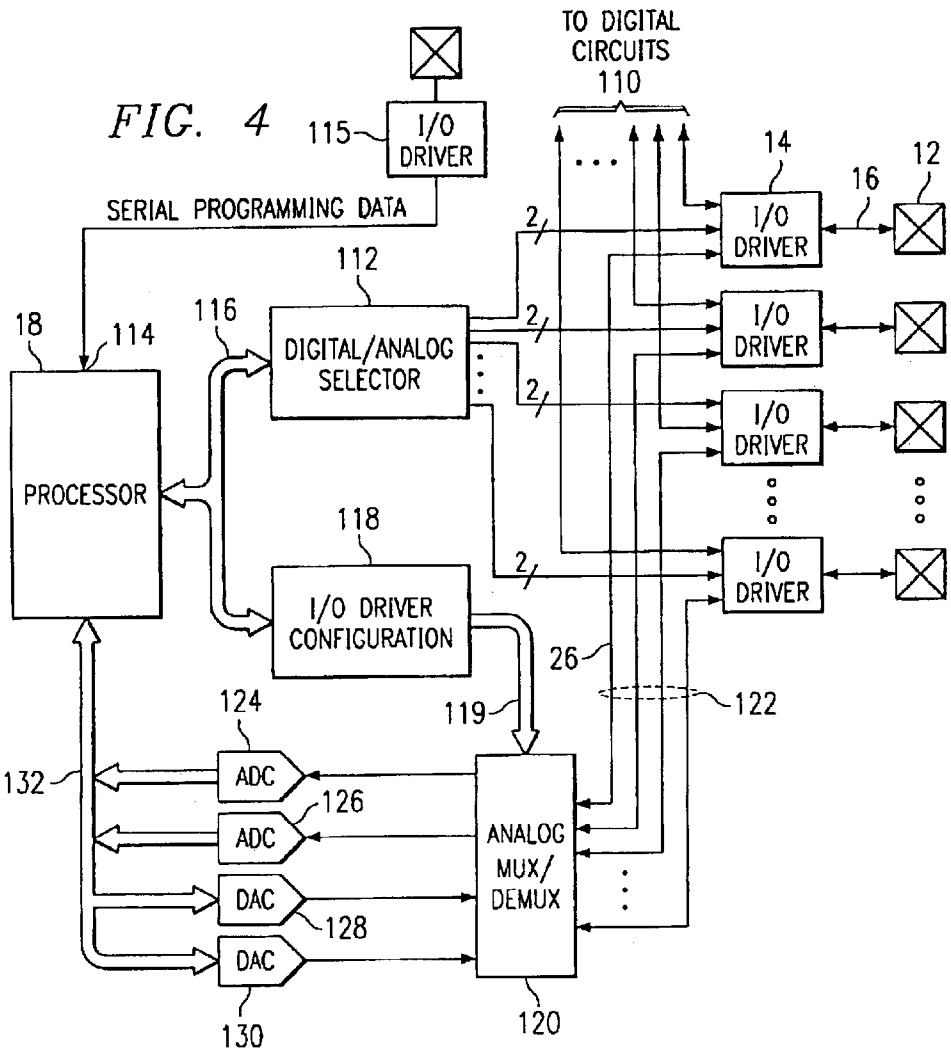
FIG. 4 illustrates in block diagram form an embodiment for multiplexing analog signals between the I/O pin interface circuits and the on-board ADC and DAC devices.

FIG. 4 illustrates a mixed signal integrated circuit employing the manner in which I/O pins can be configured to operate with either digital signals or analog signals, and particularly how each pin interface circuit can be configured to couple analog signals either to the pin interface circuits, or from the pin interface circuits. The pin interface circuits, such as pin interface circuit 14, can be constructed in the manner described above. Each pin interface circuit includes digital input and output lines 110, coupled to corresponding digital circuits (not shown). Coupled to each pin interface circuit is a digital/analog selector 112 for selecting whether the respective pin interface circuits are to be configured for analog or digital operation. The digital/analog selector 112 is registered and can be programmed on the fly by the processor 18. The processor 18 is preferably of the type having a serial port 114 for programming by a user via an I/O pin interface circuit 116.

The processor 18 has a data bus 116 coupled to the digital/analog selector 112, as well as to an I/O driver configuration circuit 118. The I/O driver configuration circuit 118 functions to provide the bidirectional coupling of different analog signals between one or more ADC devices, or one or more DAC devices, and the I/O pin interfaces. The I/O driver configuration circuit 118 is coupled to an analog mux/demux 120 by way of bus 119. The coupling of analog signals between the pin interface circuits is accomplished by the use of the analog multiplexer/demultiplexer 120. A pair of ADC devices 124 and 126 are utilized for coupling converted analog signals from the analog mux/demux 120 to the processor 18 by way of a data bus 132. A pair of DAC devices 128 and 130 functions to convert digital signals output by the processor 18 on bus 132 to corresponding analog signals. The analog signals output by the DAC devices 128 and 130 are coupled through the analog mux/demux 120 to the selected line(s) 122 to the respective pin interface circuits.

The advantage of the embodiment illustrated in FIG. 4 is that any one of the pin interface circuits can carry digital signals to and/or from the digital circuits, but any of the pin interface circuits can also be configured to carry analog signals to and/or from the analog circuits. Importantly, any one of the pin interface circuits can be enabled to carry analog signals from the analog mux/demux 120 thereto, or enabled to carry analog signals from the respective pin interface circuits to the analog mux/demux 120.

In operation, when it is desired to output a digital signal to one or more of the pin interface circuits, the processor writes the digital/analog selector 112 to place the respective pin interface circuits in a digital mode of operation. Then, the digital signals generated by other circuits (not shown) are enabled to transfer the digital signals to the pin interface circuits. The pin interface circuits can also be enabled to receive externally-generated digital signals and transfer the same to on-board digital circuits.

When it is desired to transfer analog signals to respective pin interface circuits, the processor 18 writes the digital/analog selector 112 to enable the analog circuits in the respective pin interface circuits. The processor 18 also writes the I/O driver configuration circuit 118 to select the appropriate line 122 to be active between the analog mux/demux 120 and the respective pin interface. The processor 18 then generates a digital word and transfers the same on bus 132 to the DAC devise(s). The processor 18 enables one or both of the DAC devices 128 and/or 130 to initiate the conversion process. Once the digital word has been converted to a corresponding analog voltage, the analog voltage is coupled through the analog mux/demux 120 on the selected line 122 to the respective pin interface circuit. While only DAC devices 128 and 130 are shown coupling on-board analog signals to the analog mux/demux 120, other analog circuits can be utilized for coupling analog signals thereto without undergoing a conversion process.

When it desired to couple analog signals from one or more pin interface circuits to the ADC devices 124 and/or 126, the analog circuits in the pin interfaces are enabled via the digital/analog selector 112. The pin interface circuit that is to receive the externally-generated analog voltage is coupled to the analog mux/demux 120 by one of the lines 122. That line is coupled through the mux/demux 120 to one of the ADC devices 124 or 126. The connection through the mux/demux 120 is established by the digital code placed on bus 119 by the I/O driver configuration circuit 118. As noted above, the I/O driver configuration circuit 118 is programmable by the processor 18. The selected ADC device 124 or 126 is then enabled to initiate the conversion process in converting the analog voltage to a corresponding digital words. The digital words are coupled to the processor via the bus 132.

It should be understood that various types of analog mux/demux devices 120 can be utilized so that analog signals can be carried therethrough in both directions. Moreover, the mux/demux 122 can be of the type where two or more analog signals can be switched therethrough in the same direction at the same time, depending on the need. Lastly, in some situations, it may not be necessary to couple each pin interface circuit to the analog mux/demux 120 by an individual line 122. Rather, some of the pin interface circuits can have their analog lines connected together, such as shown in FIG. 3, and the common analog line coupled to the analog mux/demux 120. In this latter instance, only one pin interface in the group can be activated at one time to carry analog signals.

Figure 5:
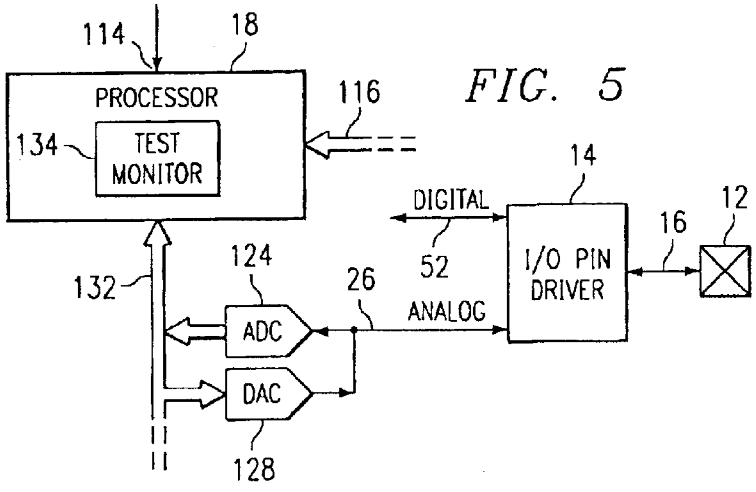
FIG. 5. Illustrates in block diagram form a technique for providing a feedback of signals to an I/O pin interface circuit, and then back to a test monitor via an ADC.

FIG. 5 illustrates an arrangement where on-board generated signals coupled to the pin interface circuit 14 can be routed back to on-board analyzing circuits to verify the integrity of such signals. Here, digital signals can be coupled to the pin interface circuit 14 on line 52 in the manner described above. FIG. 2 illustrates the details of how the digital signals can then be coupled to the input of the ADC 124 via the analog line 26. Of course, the analog transmission gate 66 must be enabled. In any event, the ADC device 124 can convert the various voltage levels of the digital signal, including transients, to corresponding digital values for processing by the processor 18. The processor can be programmed to carry out an analysis of the integrity of the digital signals generated either internally on the chip or externally. The test monitor 134 illustrates the programmed operations to carry out such analysis. Diagnostics of the various signals, including digital and analog signals, can be achieved to verify proper operation of the circuits generating the same. Indeed, analog signals output from the DAC 128 can be coupled back to the ADC 124, and the resulting digital signals coupled to the processor on bus 132 for subsequent analysis. The test monitor 134 of the processor 18 can provide different levels of alarms to indicate various problems found by the software 134.

While the preferred and other embodiments of the invention have been disclosed with reference to a specific mixed signal processing circuit, and method of operation thereof, it is to be understood that many changes in detail may be made as a matter of engineering choices, without departing from the spirit and scope of the invention, as defined by the appended claims.

What is claimed is:

1. An integrated circuit having I/O pin interface circuits providing digital and analog functions, comprising:

- at least one analog circuit formed on said integrated circuit;
- a plurality of contact pads formed on said integrated circuit;
- a plurality of I/O pin interface circuits, each I/O pin interface circuit associated with a respective one of said contact pads, each of said I/O pin interface circuits selectively coupling analog signals between said contact pads and an analog output line for each of said contact pads;
- a common analog output node connected to a plurality of said analog output lines in a wired OR configuration;
- a selection device for controlling at least one of said I/O pin interface circuits associated with said common analog output for connection of said contact pad to said common analog output node through said associated analog output line; and
- an interface circuit for connecting said common analog output node to said at least one analog circuit.

2. The integrated circuit of claim 1, further including an analog transmission gate for controlling coupling of analog signals on said contact pads to said associated analog output lines.

3. The integrated circuit of claim 1, wherein said interface circuit comprises a multiplexer circuit having a plurality of inputs and at least one output, at least of one of said inputs connected to said common analog output and said multiplexer operable to selectively connect one of said plurality of inputs to the output thereof, the output of said multiplexer connected to said at least one analog circuit.

4. The integrated circuit of claim 3, wherein said multiplexer has inputs coupled to said respective I/O pin interface circuits.

5. The integrated circuit of claim 3, wherein each input of said multiplexer is connected to a plurality of different I/O pin interface circuits.

6. The integrated circuit of claim 3, wherein said at least one analog circuit comprises an analog-to-digital converter.

7. The integrated circuit of claim 1, and further comprising:

a plurality of digital circuits;

each of said plurality of I/O pin interface circuits operable to couple digital signals between respective contact pads and said digital circuits, at least one of said I/O pin interfaces selectively coupling either analog signals between said contact pads and said analog output line for each of said contact pads, or coupling digital signals between their respective contact pads and select ones of said digital circuits.

8. The integrated circuit of claim 7, wherein each of said I/O pin interface circuits includes:

a digital section including a digital driver for driving said associated contact pad and a digital receiver for receiving a digital signal from said associated contact pad and transmitting it to a digital line; and an analog section comprising an analog transmission gate that is controlled by said selection device to either connect said contact pad to said associated analog output line or isolate said contact pad from said associated analog output line.

9. The integrated circuit of claim 8, wherein said selection device is operable to connect said contact pad to said analog output line when either said digital section and said digital transmitter are transmitting digital data to said contact pad, or digital data is being received at said contact pad and transferred to said digital line by said digital receiver.

10. The integrated circuit of claim 1, wherein:

said plurality of I/O pin interface circuits are arranged in a plurality of groups, each of said groups having an associated common analog output node connected to the ones of said plurality said analog output lines associated with the ones of said I/O pin interfaces circuits in said group in a wired OR configuration;

said selection device operable to select at least one of said I/O pin interface circuits in each of said groups associated with said associated common analog output node for connection of said contact pad to said associated common analog output node through said associated analog output line; and wherein said interface circuit is operable to selectively connect one of said plurality of common analog output nodes to said at least one analog circuit.

* * * * *